United States Patent
Lee

(12) 
(10) Patent No.: US 6,498,756 B2
(45) Date of Patent: Dec. 24, 2002

(54) SEMICONDUCTOR MEMORY DEVICE HAVING ROW REPAIR CIRCUITRY

(75) Inventor: Jung Seop Lee, Kyoungki-do (KR)

(73) Assignee: Hynix Semiconductor Inc. (KR)

( * ) Notice: Subject to any disclaimer, the term of this patent is extended or adjusted under 35 U.S.C. 154(b) by 0 days.

(21) Appl. No.: 09/891,508

(22) Filed: Jun. 27, 2001

(65) Prior Publication Data

US 2002/0003279 A1 Jan. 10, 2002

(30) Foreign Application Priority Data

Jun. 28, 2000 (KR) ........................................ 2000-36158
May 4, 2001 (KR) ........................................ 2001-24263

(51) Int. Cl.[7] ................................................ G11C 7/00
(52) U.S. Cl. ................ 365/200; 365/230.03; 365/225.7
(58) Field of Search ............................. 365/200, 227.5, 365/230.03, 230.06, 230.08

(56) References Cited

U.S. PATENT DOCUMENTS 5,359,560 A * 10/1994 Suh et al. .................... 365/200
5,689,465 A * 11/1997 Sukegawa et al. ........... 365/200
5,831,914 A * 11/1998 Kirihata ....................... 365/200
5,978,931 A * 11/1999 Kirihata et al. ................. 714/7
6,094,382 A * 7/2000 Choi et al. ................... 365/200
6,233,183 B1 * 5/2001 Kim et al. .................... 365/200
6,252,808 B1 * 6/2001 Yoo ............................ 365/200
6,304,498 B1 * 10/2001 Ikeda .......................... 365/200

* cited by examiner

Primary Examiner—Hoai Ho
Assistant Examiner—Gene N. Auduong
(74) Attorney, Agent, or Firm—Pillsbury Winthrop LLP

(57) ABSTRACT

The disclosure is a semiconductor memory device cooperated with row repair circuitry by which defective wordlines are substituted with redundant wordlines regardless of locations of cell array blocks, the redundant wordlines being arranged in a specific cell array block. The semiconductor memory device includes a plurality of memory blocks at least one of which includes a plurality of redundant wordlines; a plurality of row repair fuse boxes the number of which is the same with the number of the redundant wordlines, the fuse boxes being divisionally arranged with the same number respective in the memory blocks; and repair means to repair a defective wordline with the redundant wordline, the redundant wordlines corresponding to the row repair fuse boxes each by each.

17 Claims, 13 Drawing Sheets

SEMICONDUCTOR MEMORY DEVICE HAVING ROW REPAIR CIRCUITRY

This application relies for priority upon Korean Patent Application No. 2000-36158, filed on Jun. 28, 2000 and No. 2001-24263, filed on May 4, 2001, the contents of which are herein incorporated by reference in their entirety.

FIELD OF THE INVENTION

The present invention generally relates to a semiconductor memory device having a capacity of redundancy, and more particularly to a semiconductor memory device with row repair circuitry by which defective wordlines are substituted with redundant wordlines regardless of locations of cell array blocks, the redundant wordlines being arranged in a specific cell array block.

BACKGROUND OF THE INVENTION

It is usually occasional that various kinds of defects are generated throughout a manufacturing process for a semiconductor memory device (e.g., a DRAM), causing the memory device to be in a malfunction and reducing a yield thereof. Even one defect over a cell array in the semiconductor memory device may easily turn it out of normal operations such as data read-out and write-in. For this reason, it is recommended to substitute defective memory cells with additionally prepared memory cells (i.e., redundant or spare memory cells) in correspondence with their addresses, i.e., "redundancy", increasing a product yield and reliability of the memory device. When one or more defective memory cells are detected by a test operation, the defective memory cells are substituted with the redundant memory cells that are arranged in the unit of row or column in a memory cell array of the memory device, without abandoning the memory device even though it has the defective cells.

In a conventional 64 M (64 megabits; $M=2^{20}$) DRAM constructed of four memory banks, each bank has the storage capacity of 16 M with being formed of a plurality of memory blocks, as shown in FIG. 1, and peripheral block PBL in which input/output pads are arranged includes input/output buffers and multiplexers assigned to the input/output pads. The peripheral block PBL in which pads for address and control signals are positioned includes control signal buffers and address buffers being coupled to their corresponding pads, and further a control logic unit and a command state machine. Column control logic blocks CCL0~CCL3 each assigned to their corresponding memory banks have Y-decoders (or column decoders), drivers and data bus sense amplifiers to write data in memory cells or to read data from memory cells. Row control logic blocks RCL0~RCL3 each assigned to their corresponding memory banks include X-decoders (or row decoders) and logic circuits for driving wordlines.

And, each of the memory blocks has a predetermined number of redundant wordlines being assigned thereto exclusively. According to the fashion of redundancy in this manner, since defective wordlines yet repairable is limited by the predetermined number of redundant wordlines, the device shown in FIG. 1 may come up with a limitation to enhance the efficiency of repairing the defective wordlines (or memory cells). For instance, when the number of defective memory cells is greater than that of redundant wordlines in the memory bank MB1, it is impossible to repair the defective wordlines in excess of the capacity of the redundant wordlines therein.

SUMMARY OF THE INVENTION

It is, therefore, an object of the present invention to provide a semiconductor memory device capable of enhancing the efficiency of repairing defective memory cells.

It is another object of the present invention to provide a semiconductor memory device capable of repairing defective wordlines without positional restriction of defective wordlines.

In order to attain the above objects, according to an aspect of the present invention, there is provided a semiconductor memory device having a function of row repair, including a plurality of memory blocks where at least one of them includes a predetermined number of redundant wordlines, the predetermined number of row repair fuse boxes being divisionally arranged to be the same with the number of the memory blocks, and repair means to replace defective wordlines with the redundant wordlines, each redundant wordline corresponds to one of the row repair fuse boxes respectively.

The present invention will be better understood from the following detailed description of the exemplary embodiment thereof taken in conjunction with the accompanying drawings, and its scope will be pointed out in the appended claims.

BRIEF DESCRIPTION OF THE DRAWINGS

A more complete appreciation of the present invention, and many of the attendant advantages thereof, will become readily apparent as the same becomes better understood by reference to the following detailed description when considered in conjunction with the accompanying drawings in which like reference symbols indicate the same or similar components, wherein.

DESCRIPTION OF THE PREFERRED EMBODIMENT

It should be understood that the description of the preferred embodiment is merely illustrative and it should not be taken in a limiting sense. In the following detailed description, several specific details are set forth in order to provide a thorough understanding of the present invention. It will be obvious, however, to one skilled in the art that the present invention may be practiced without these specific details.

Figure 1:
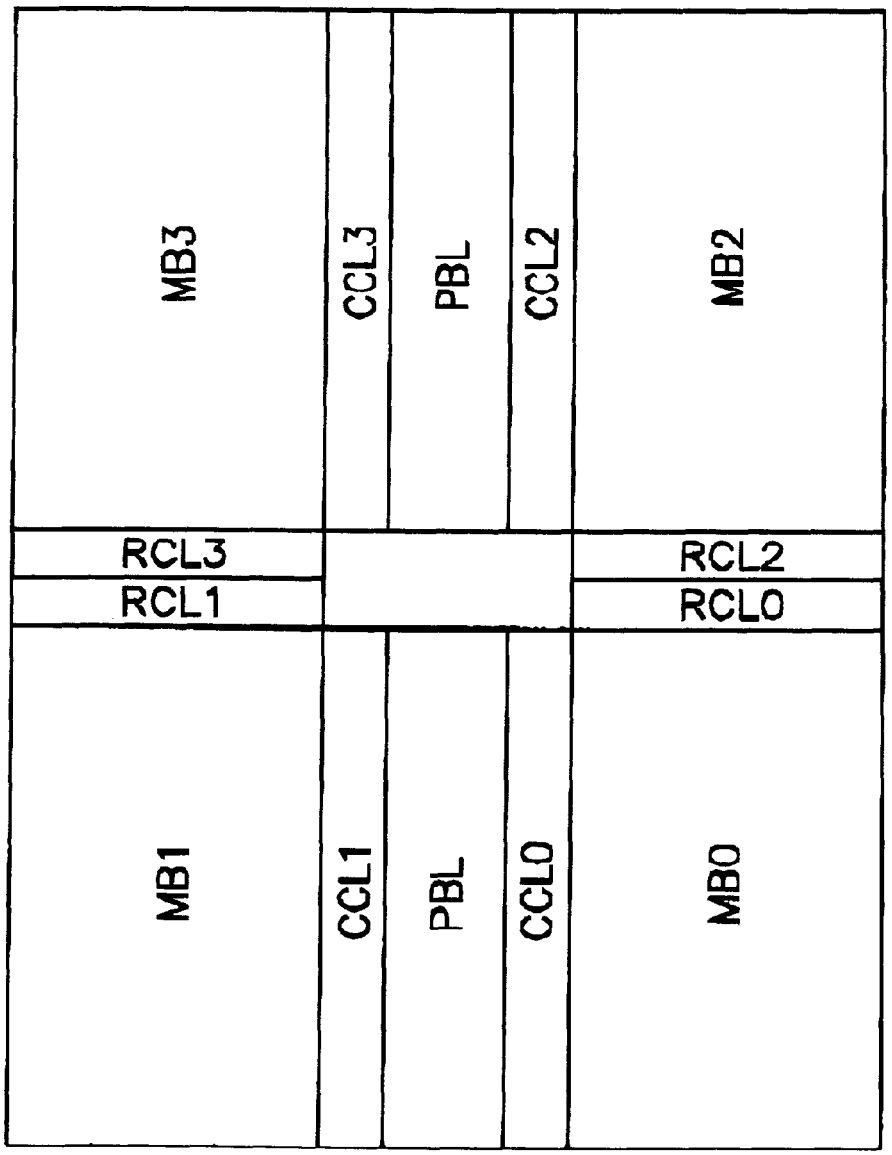
FIG. 1 is a block diagram illustrating architecture of a general 64 M synchronous DRAM.
Figure 2:
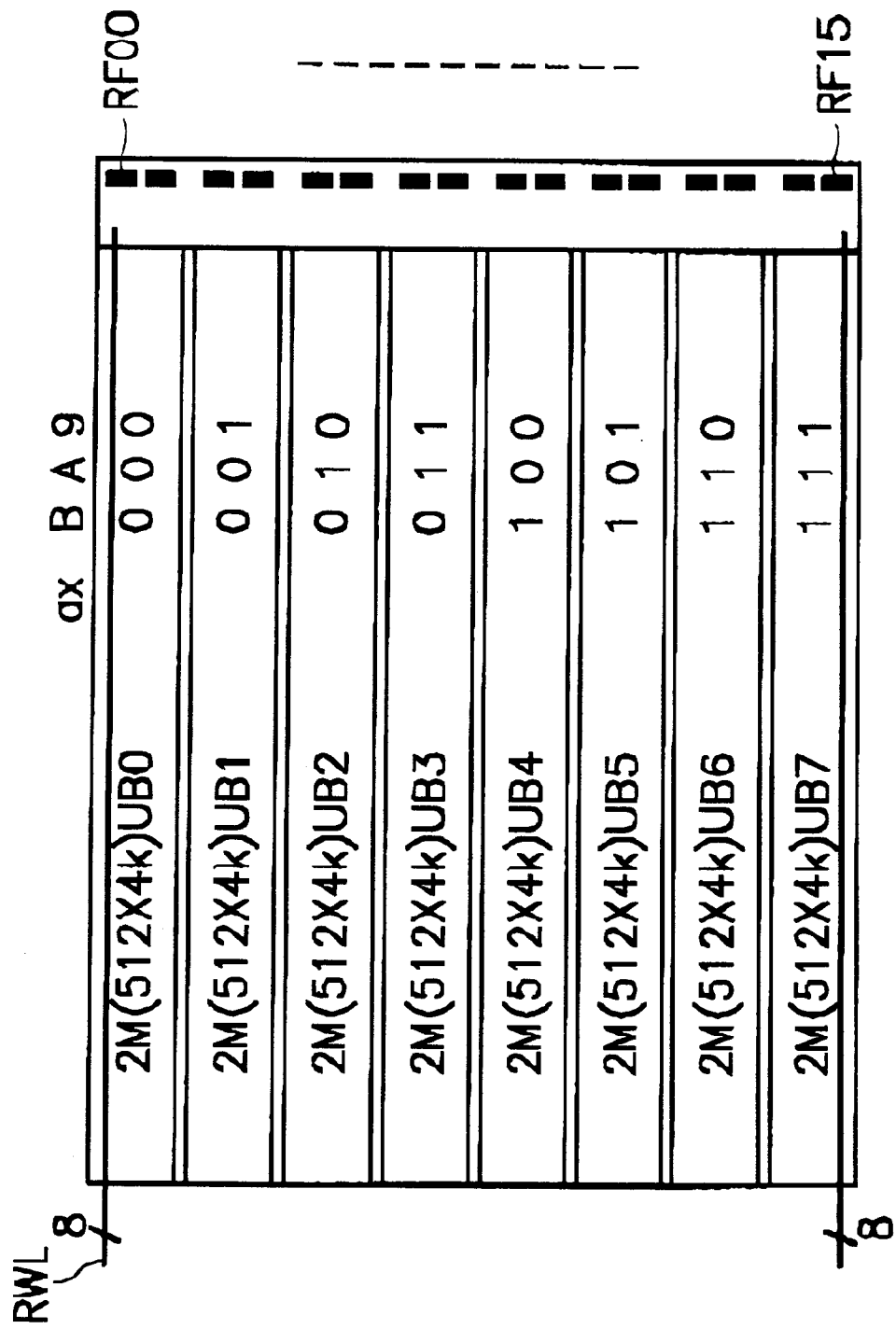
FIG. 2 is a block diagram showing a disposition of row repair fuse boxes in a memory bank according to a preferred embodiment of the invention.

Referring to FIG. 2, a memory bank (e.g., MB1) is constructed of eight memory blocks UB0~UB7 each having the capacity of 2 M, and sixteen row repair fuse boxes RF00~RF15. Each memory block is constituted of 512 rows and 4 K ($K=2^{10}=1024$), or, in other words, 512 wordlines and 4 K bitlines. The address for designating the eight memory blocks is composed of three address bits axB, axA, and ax9 (three bits can select eight blocks; $2^3=8$). The external address bit axB is the most significant bit (MSB).

Each memory block has a unit of the row control logic block, and the unit includes two row repair fuse boxes. That is, two row repair fuse boxes are allocated into each memory block. And, redundant wordlines RWLs are disposed in the first memory block UB0 and the eighth memory block UB7, each by eight. Thus, two groups of the memory blocks are differentiated by the MSB (i.e., axB) "0" and "1" of the block address, UB0~UB3 and UB4~UB7, and each group is assigned to eight redundant wordlines arranged in the UB0 or UB7, respectively. As each redundant wordline RWL corresponds to one of the fuse boxes respectively, the row repair fuse boxes RF00~RF15 can drive the sixteen redundant wordlines RWLs at a maximum of sixteen normal wordlines that are defective in each bank. If a specific wordline is detected as being defective, the first one of the redundant wordlines located at the topside become conductive in a repair operation.

While the aforementioned redundancy constitution which is flexible with the unit of the 2 M memory block, is to shorten an enable time of the wordlines, it is possible to modify the elastic range in constructing the redundancy architecture such as with the unit of 8 M memory block if there is no considerable burden of the wordline enable time. Referring to 2, the eight redundant wordlines arranged in the memory block UB0 corresponding to the axB (i.e., MSB "0") are driven into the repair operation by means of the row repair fuse boxes RF00~RF07 disposed in UB0~UB3. And, other eight redundant wordlines in UB7 corresponding to the axB (i.e., MSB "1") are utilized in the repair operation by means of the row repair fuse boxes RF08~RF15.

Figure 3:
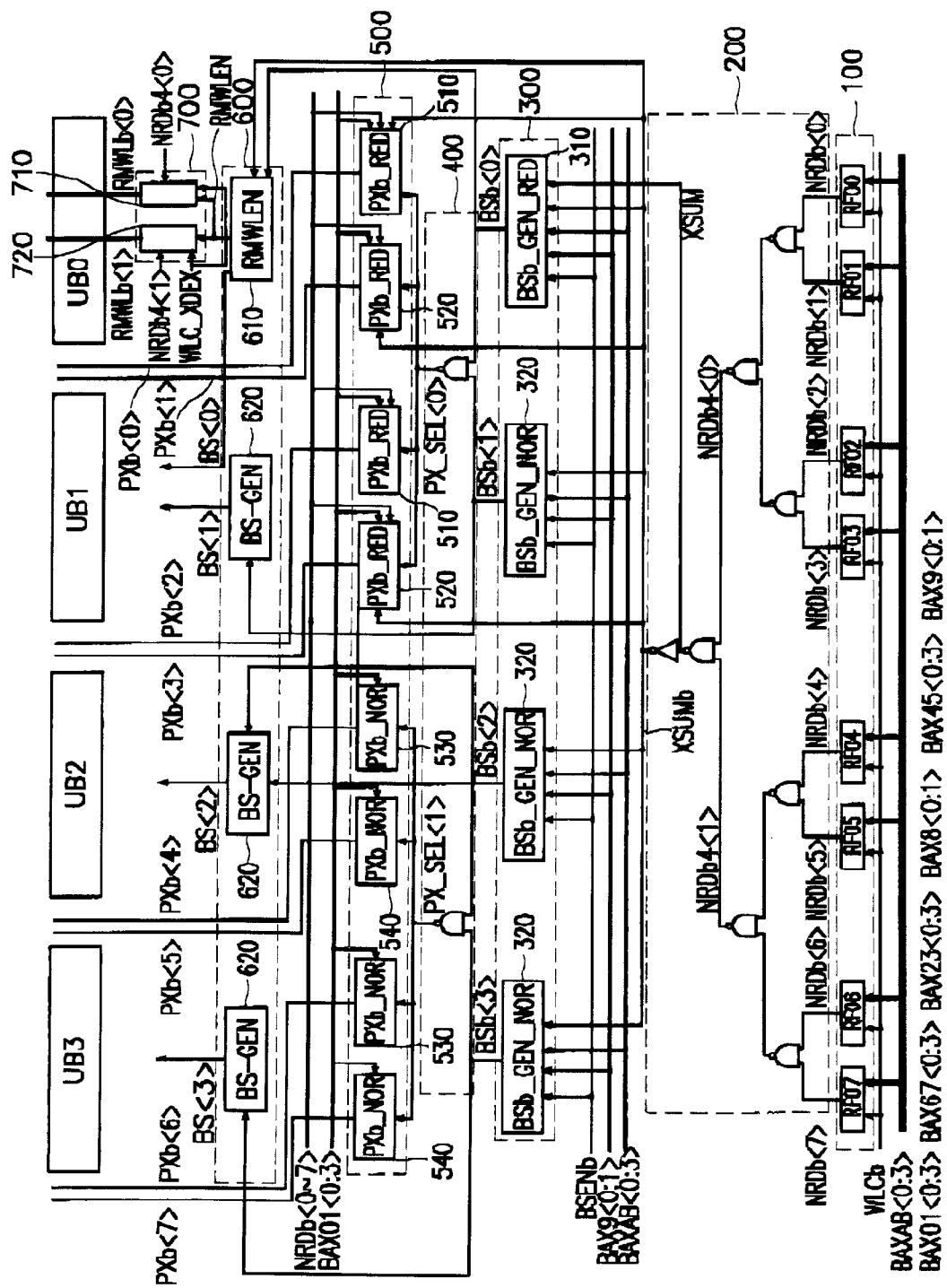
FIG. 3 is a schematic block diagram of a semiconductor memory device including row repair fuse boxes and the peripheral thereof, according to the preferred embodiment of the invention.

FIG. 3 shows a construction of row repair circuitry embodied in a semiconductor memory device, only including eight row repair fuse boxes RF00~RF07 and four memory blocks UB0~UB3, corresponding to the block address bit axB "0". It can be understood that the other half corresponding to the axB "1" has the same constitution with that shown in FIG. 3, in consideration with that a unit of the flexible scope of redundancy practiced in the invention is eight redundant wordlines and fuse boxes for four 2 M memory blocks as aforementioned. Hereinafter, the overall constitution of FIG. 3 is referred to as a repair unit.

The repair unit consists of four memory blocks UB0~UB3, block 100 of the row repair fuse boxes RF00~RF07, fuse summation circuit 200, block selection circuits group 300, sub wordline driver selection circuit 400, sub wordline drivers group 500, wordline enable signal generators group 600, and main wordline drivers group 700.

The four memory blocks include the first memory block UB0 in which the eight redundant wordlines are arranged. The row repair fuse boxes RF00~RF07 in the block 100 receive row addresses BAX01<0:3>, BAX23<0:3>, BAX45<0:3>, BAX67<0:3>, and BAX8<0:1>, and block addresses BAX9<0:1> and BAXAB<0:3>, and then generate fuse decoding signals NRDb<0:7>. The row and block addresses are generated from a pre-decoder (not shown). The fuse summation circuit 200 combines the fuse decoding signals NRDb<0:7> with logic gates, and then generates summation signals NRDb4<0:1>, a repair information signal pair XSUM/XSUMb (XSUMb is a complementary signal of XSUM). XSUMb and XSUM will be referred to as the first and second repair information signals, respectively. The block selection circuits group 300 includes redundant block selection circuit 310 and three normal block selection circuits 320s, all those receiving the block selection addresses BAX9<0:1> and BAXAB<0:3>, and block selection enable signal BSENb, and then generating block selection signals BSb<0:3>. The sub wordline driver selection circuit 400 inputs the block selection signal BSb<0:3> and then generates sub wordline driver selection signal PX_SEL<0:1>.

The sub wordline drivers group 500 includes four redundant sub wordline drivers 510s and 520s, and four normal sub wordline drivers 530s and 540s. The selection signal PX_SEL<0> is applied to the redundant sub wordline drivers 510s and 520s in common, while PX_SEL<1> is applied to the normal sub wordline drivers 530s and 540s. While the pre-decoded row address signals BAX01<0:3> are applied to all of the drivers, the first repair information signal XSUMb and the fuse decoding signals NRDb<0:7> are applied to the redundant sub wordline drivers 310s and 320s. Then, the eight sub wordline drivers generate eight sub wordline drive signals PXb<0:7> to activate their corresponding sub wordlines.

Wordline enable signal generators group 600 includes redundant wordline enable signal generator 610 and three normal wordline enable signal generators 620s which, respectively, receives block selection signals BSb<0:3> and then generates normal main wordline enable signals BS<0:3>. The redundant wordline enable signal generator 610 inputs the first repair information signal XSUMb and further generates redundant main wordline enable signal RMWLEN. The redundant main wordline drivers group 700 includes two redundant main wordline drivers 710 and 720 which generate redundant main wordline drive signals RMWL<0:1>, respectively, in response to driver precharge signal WLC_XDEC and the redundant main wordline enable signal RMWLEN in common, and the summation signals NRb4<0:1>. The eight redundant wordlines RWLs will be conductive by decoding the sub wordline drive signals PXb<0:7> and the redundant main wordline drive signals RMWL<0:1>.

Figure 4:
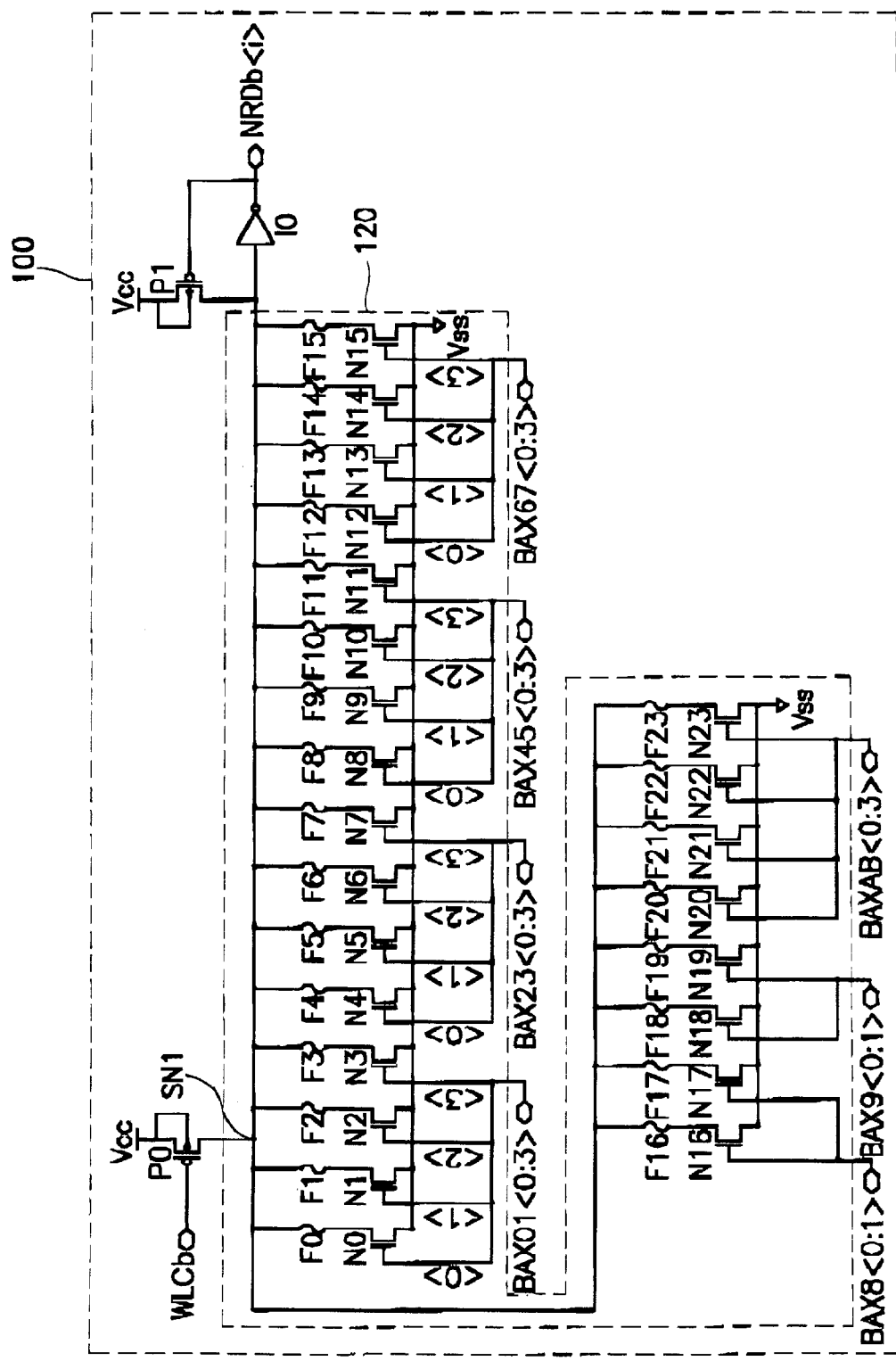
FIG. 4 is a circuit diagram of the row repair fuse box shown in FIG. 3.

All of the fuse boxes have the same constructions. The row repair fuse box (e.g., any one of RF00~RF07), referring to FIG. 4, is formed of fuse decoder 120 generating fuse decoding signal NRDb<i> (i is one of 0~7) in response to a state at sensing node SN1 that is dependent upon parallel fusing loops responding to the predecoded row and block addresses, BAX01<0:3>~BAX8<0:1>, BAX9<0:1>, and BAXAB<0:3>, PMOS transistor P0 connected between power supply voltage Vcc and the sensing node SN1, inverter I0 reversing a logic state of the sensing node SN1, and PMOS transistor P1 connected between Vcc and SN1. Gates of the PMOS transistors, P0 and P1, are coupled to precharge signal WLCb and output of the inverter I0. The PMOS transistor P1 and the inverter I0 constitutes a latch circuit to hold a current signal level of the fuse decoding signal NRDb<i> before new address information relevant to defective wordlines is introduced thereto.

The fuse decoder 120 is constructed of a plurality of fuses F0~F23 whose ends are connected to the sensing node SN1, and NMOS transistors N0~N23 connected between other ends of the fuses F0~F23 and substrate voltage Vss (or ground voltage). Gates of the NMOS transistors N0~N15 are coupled to the row address signals BAX01<0:3>, BAX23<0:3>, BAX45<0:3>, and BAX67<0:3>, by four in this order. Gates of the NMOS transistors N16 and N17 are coupled to row address signals BAX8<0:1>, respectively. Gates of the NMOS transistors N18 and N19 are coupled to block address signals BAX9<0:1>, and gates of the NMOS transistors N20~N23 are coupled to block address signals BAXAB<0:3>, respectively.

The precharge signal WLCb is a negative logic signal that is active with a low level to charge SN1 by turning the PMOS transistor P0 on and inactive with a high level. The fuse decoding signal NRDb<i> goes to a low level when a repair operation needs to be carried out, while maintains a high level (i.e., a precharge level at SN1) when there is no occurrence of repairing. The pre-decoded row address signals BAX01<0:3>~BAX8<0:1> are internal address signals made by a pre-decoder that generates the signals from external address signals which are supplied into the semiconductor device in response to an activation of a row address strobe signal.

In an operation of the row repair fuse box shown in FIG. 4, first, the fuses F0~F23 are prepared to be adaptable to the row address for defective wordlines after a test operation that detects which addresses are assigned to memory cells having read/write fails. When the precharge signal WLCb is set on a low level, the PMOS transistor P0 is turned on and thereby the sensing node SN1 is charged up to a high voltage level according to the power supply voltage Vcc. The PMOS transistor P1 and the inverter I0 hold the sensing node SN1 at the precharge voltage of a high level. In a row active state, as WLCb maintains a high level, the PMOS transistor P0 is turned off. And then, the sensing node maintains the precharge level when the row address signals BAX01<0:3>~BAX8<0:1> and the block address signals BAX9<0:1> and BAXAB<0:3> agree to those of a defective wordline. On the contrary, the row and block address signals different from the defective address signals make the sensing node SN1 fall down to a low level, and thereby the fuse decoding signal NRDb is established to a high level.

Figure 5:
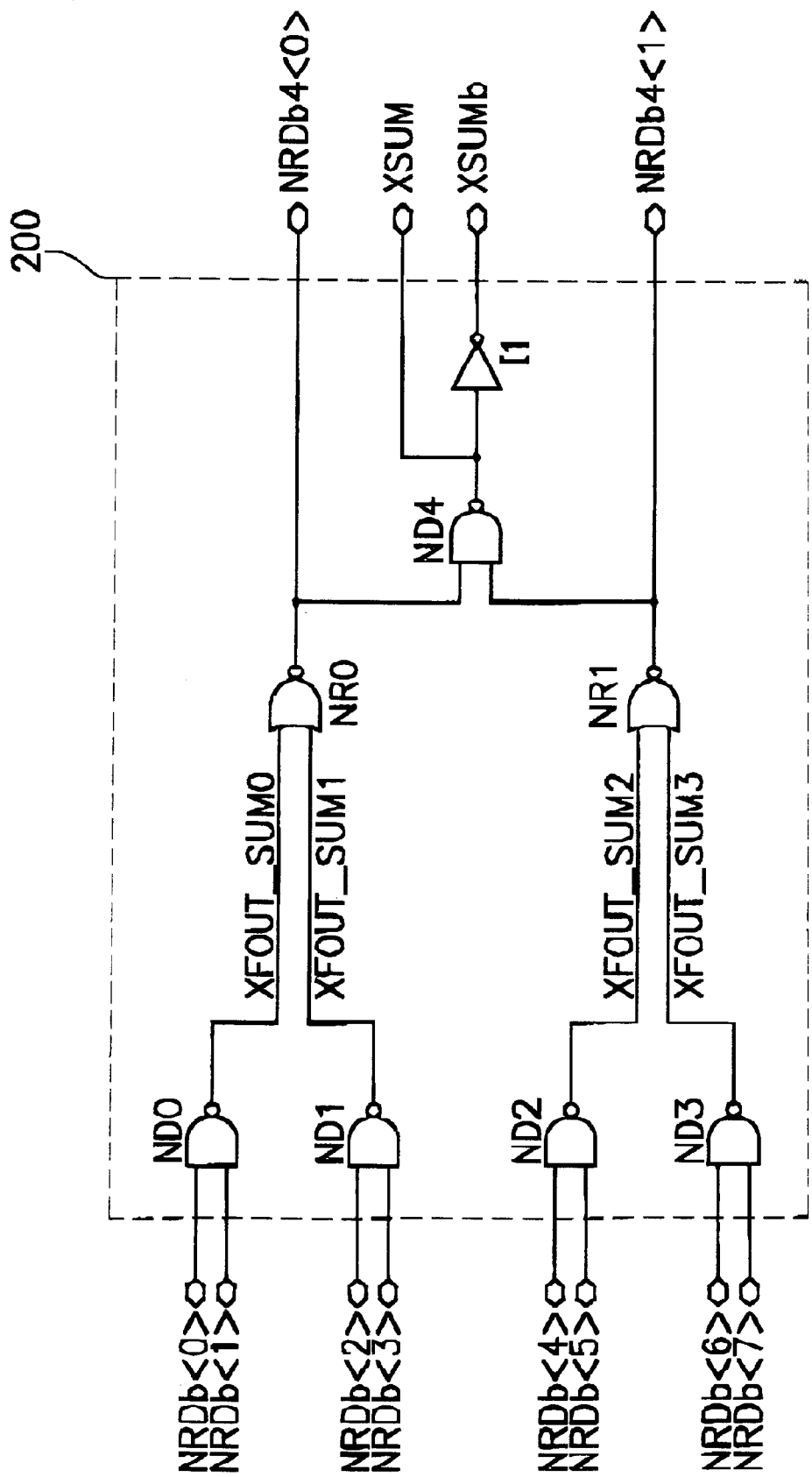
FIG. 5 is a circuit diagram of a fuse summation circuit shown in FIG. 3.

The fuse summation circuit 200, referring to FIG. 5, for combining the fuse decoding signals NRDb<0:7> into logic loops to make the summation signals NRDb4<0:1> and the repair information signals XSUM/XSUMb, is constructed of NAND gate ND0 receiving the fuse decoding signals NRDb<0:1> generated respectively from the fuse boxes RF00 and RF01, NAND gate ND1 receiving NRDb<2:3>, NAND gate ND2 receiving NRDb<4:5>, NAND gate ND3 receiving NRDb<6:7>, NOR gate NR0 receiving output signal XFOUT_SUM0 from the NAND gate ND0 and output signal XFOUT_SUM1 from the NAND gate ND1 and then generating the summation signal NRDb4<0>, NOR gate NR1 receiving output signal XFOUT_SUM2 from the NAND gate ND2 and output signal XFOUT_SUM3 from the NAND gate ND3 and then generating the summation signal NRDb4<1>, NAND gate ND4 receiving output signals from the NOR gates NR0 and NR1 and then generating the second repair information signal XSUM, and inverter I1 converting output signal of the NAND gate ND4 into the first repair information signal XSUMb.

The summation signal NRDb4<0> is made from logic combination with the four fuse decoding signals NRDb<0:3> each generated from the four row repair fuse boxes RF00~RF03, and the summation signal NRDb4<1> is made from logic combination with the four fuse decoding signals NRDb<4:7> each generated from the four row repair fuse boxes RF04~RF07. Therefore, if any of the fuse decoding signals NRDb<0:7> is a low level that informs of repairing, the summation signals NRDb4<0:1> are changed to the low levels. While, if there is no repair when all of the fuses decoding signals are at the high levels, the summation signals are lain on the high levels. The second repair information signal XSUM has contrary phases from those of the first repair information signal XSUMb.

Figure 6:
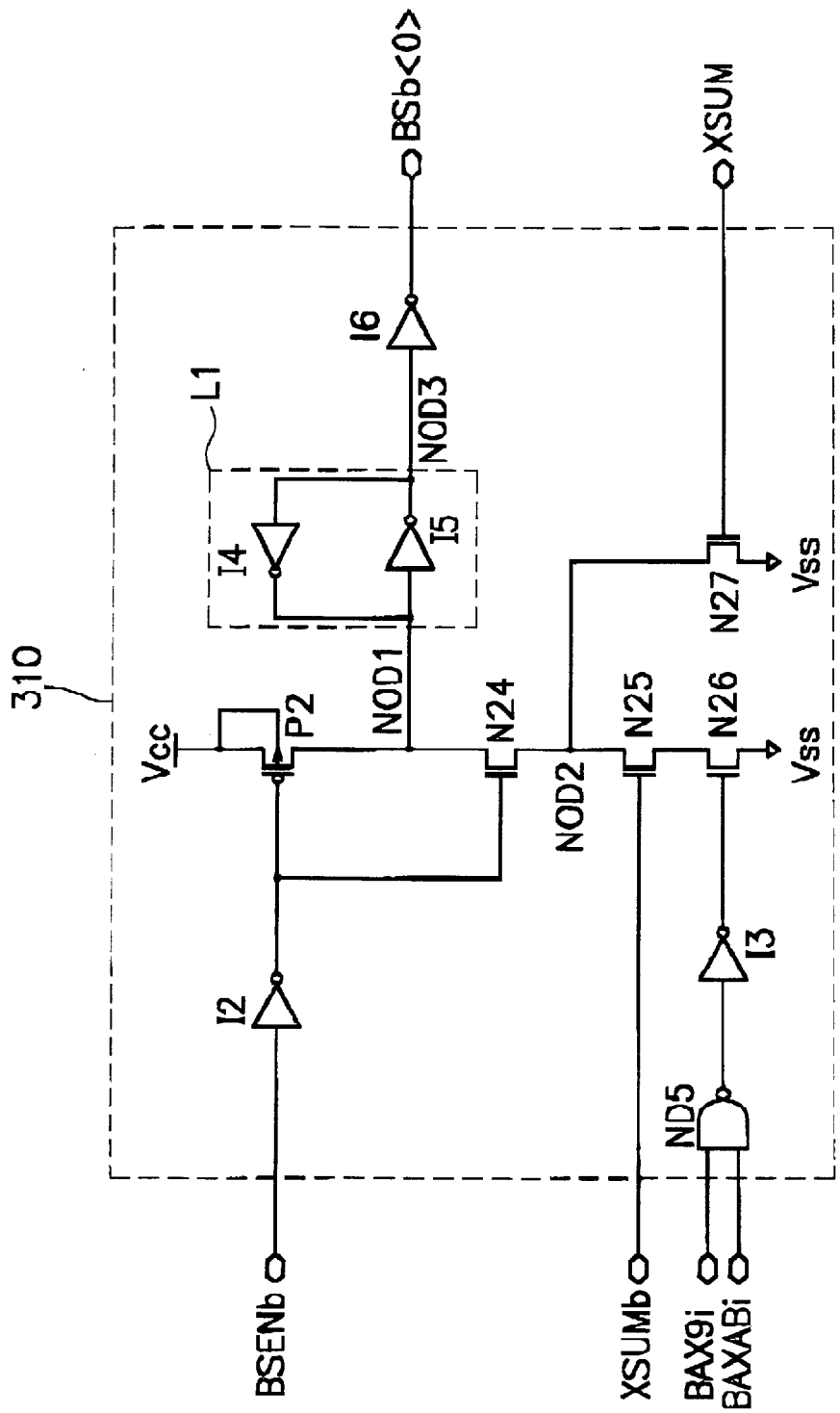
FIG. 6 is a circuit diagram of a redundant block selection circuit shown in FIG. 3.

Referring to FIG. 6, the redundant block selection circuit 310, is included in the block 300 together with the three normal block selection circuits 320s, and it determines whether to receive or not the block address signals BAX9i and BAXABi from monitoring the summation result with the fuse decoding signals NRDb<i>.

The block selection operation in this embodiment is to select an alternative one of the eight memory blocks belonging to a memory bank by means of the predecoded block address signals BAX9i and BAXABi which are introduced in the memory device in response to the row activation where a row address strobe signal is enabled. The present embodiment employs the flexible row repair operation in which the memory block including the redundant wordlines is forced to be activated whenever there is a need of repair.

The redundant block selection circuit 310 shown in FIG. 6 activates a memory block corresponding to the block address signals BAX9i/BAXABi by using the first repair information signal XSUMb of a high level when there is no need of repair after monitoring the summation result with the fuse decoding signal NRDb<i>. On the other hand, if the the first repair information signal XSUMb becomes a low level while the second repair information signal XSUM is at a high level when there is need of repair, responding to a transition of the fuse decoding signal NRDb<i>, the second repair information signal XSUM makes the selection circuit 310 not be affected from the block address signals BAX9i/BAXABi and then activates the memory block (e.g., UB0) including the redundant wordlines.

The redundant block selection circuit 310, as shown in FIG. 6, is constructed of inverter I2 converting the block selection enable signal BSENb into its reverse signal, PMOS transistor P2 connected between Vcc and node NOD1 and having its gate coupled to an output signal of the inverter I1, NMOS transistor N24 connected between the nodes NOD1 and node NOD2 and having its gate coupled to the output of the inverter I1, NMOS transistor N25 connected between the node NOD2 and Vss and having its gate coupled to the first repair information signal XSUMb, NAND gate ND5 receiving the block address signals BAX9i/BAXABi, inverter I3 converting an output signal of the NAND gate ND5 into its reverse signal, NMOS transistor N26 connected between the NMOS transistor N25 and Vss and having its gate coupled to the output signal of the inverter I3, NMOS transistor N27 connected between the node NOD2 and Vss and a gate coupled to the second repair information signal XSUM, latch circuit L1 formed of two inverters I4 and I5 and connected between the node NOD1 and node NOD2, and inverter I6 converting an output signal of the latch circuit LI into redundant block selection signal BSb<0>.

With respect to an operation in the redundant block selection circuit 310, the block selection enable signal BSENb is set up to a low level when a corresponding memory bank is conductive, while maintaining a high level to precharge the block selection signal BSb<0> during a precharge mode.

In a normal active mode, the block selection enable signal BSENb of a low level turns the NMOS transistor N24 on. At this time, the first repair information signal XSUMb and the block address signals BAX9i/BAXABi go to high levels, so that the NMOS transistors N25 and N26 are turned on and thereby the redundant block selection signal BSb<0> goes to a low level to select the memory block of the redundant wordlines. While, the second repair information signal XSUM is laid on a low level to turn the NMOS transistor N27 off.

Next, in a repair mode, the first repair information signal XSUMb is a low level to prevent an incoming of the block address signals BAX9i/BAXABi thereto, and a high transition of the second repair information signal XSUM causes the redundant block selection signal BSb<0> to be a low level.

Figure 7:
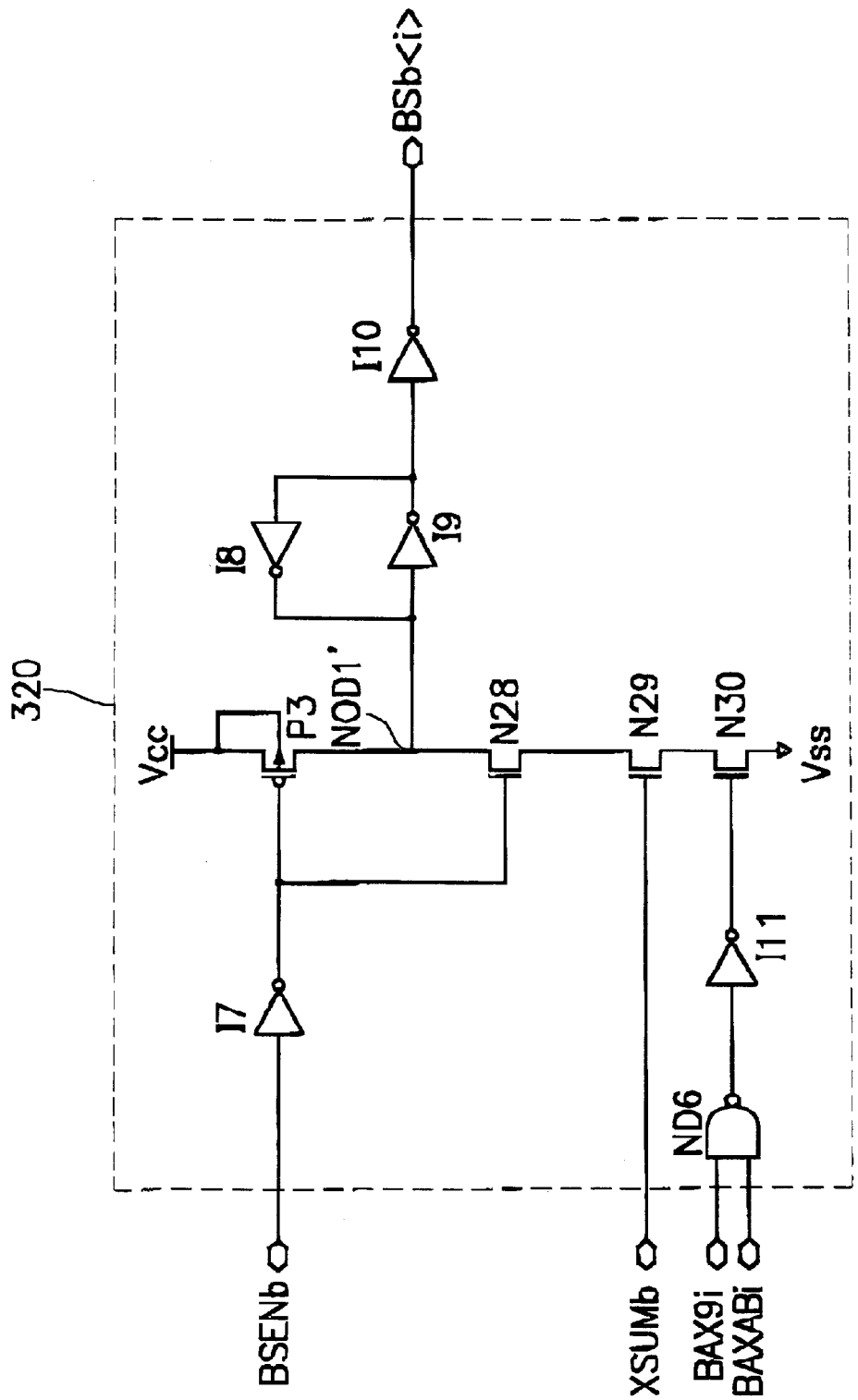
FIG. 7 is a circuit diagram of a normal block selection circuit shown in FIG. 3.

The normal block selection circuit 320, referring to FIG. 7, has the same construction with that of the redundant block selection circuit 310 except that the second repair information signal XSUM is not applied thereto (e.g., through the NMOS transistor N27 of FIG. 6). The first repair information signal XSUMb, being applied to NMOS transistor N29 connected between node NOD1' (corresponding to the node NOD1 in FIG. 6) and NMOS transistor N30 (corresponding to the NMOS transistor N26 in FIG. 6), determines whether or not the block address signals BAX9i/BAXABi are permitted to be introduced thereto. Other operating features are identical to those of the redundant block selection circuit 310 shown in FIG. 6.

Figure 8:
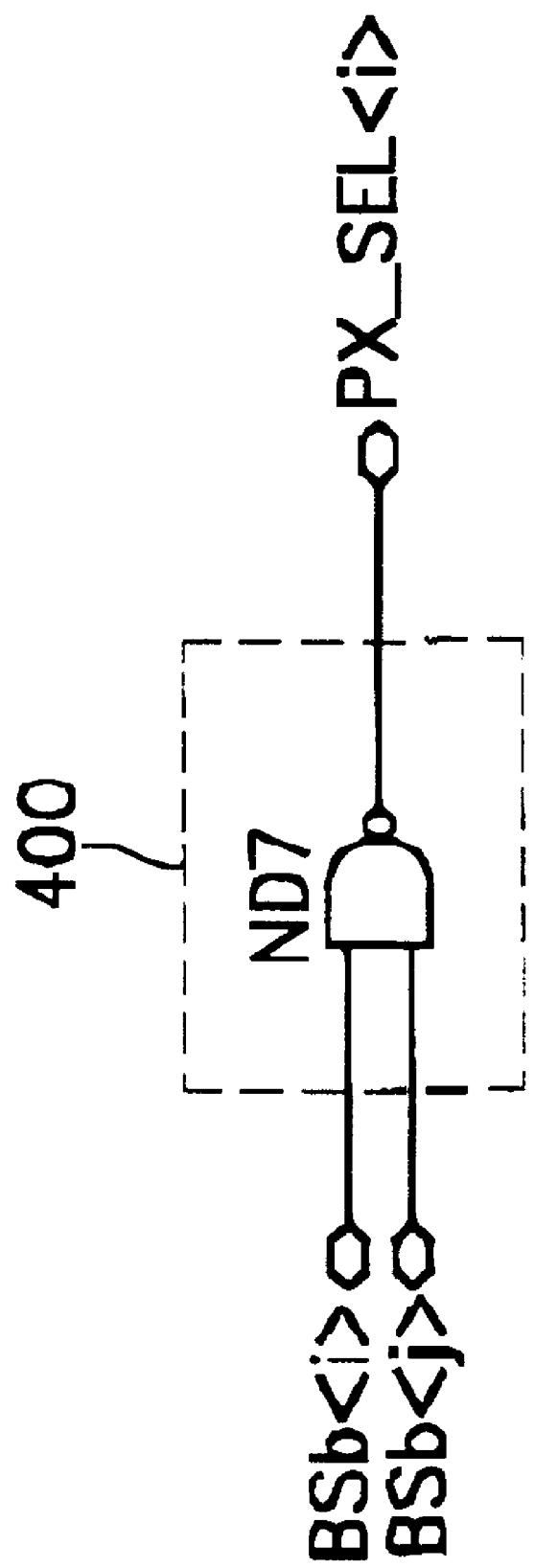
FIG. 8 is a circuit diagram of a sub wordline driver selection circuit shown in FIG. 3.

The sub wordline driver selection circuit 400 shown in FIG. 3 includes NAND gates for the normal and memory blocks, respectively. Each NAND gate forms a unit of the sub wordline driver selection circuit. Referring to FIG. 8, the NAND gate ND27 as the sub wordline selection unit receives two block selection signals BSb<i> and BSb<j>, and then generates sub wordline driver selection signal PX_SEL<i>.

It is assumed that the block selection signal for the memory block UB0 is BSb<0>, and the block selection signal for the memory block UB1 is BSb<1>. As the block selection signals BSb<0> and BSb<1> are negative logic signals (i.e., active with low levels), the sub wordline driver selection signal PX_SEL<0> becomes a high level.

The sub wordline drivers are assigned to a memory block by two as shown in FIG. 3. For example, two redundant sub wordline drivers 510 and 520 are associated with the memory block UB0, as well as with the memory block UB1. Two normal sub wordline drivers 530 and 540 are assigned to the memory blocks UB2 and UB3, respectively. The sub wordline drive signal PXb<i> (i is one of 0~7) will be utilized to operate the redundant wordline together with the redundant main wordline drive signals RWLb<0> and RWLb<1>.

Figure 9:
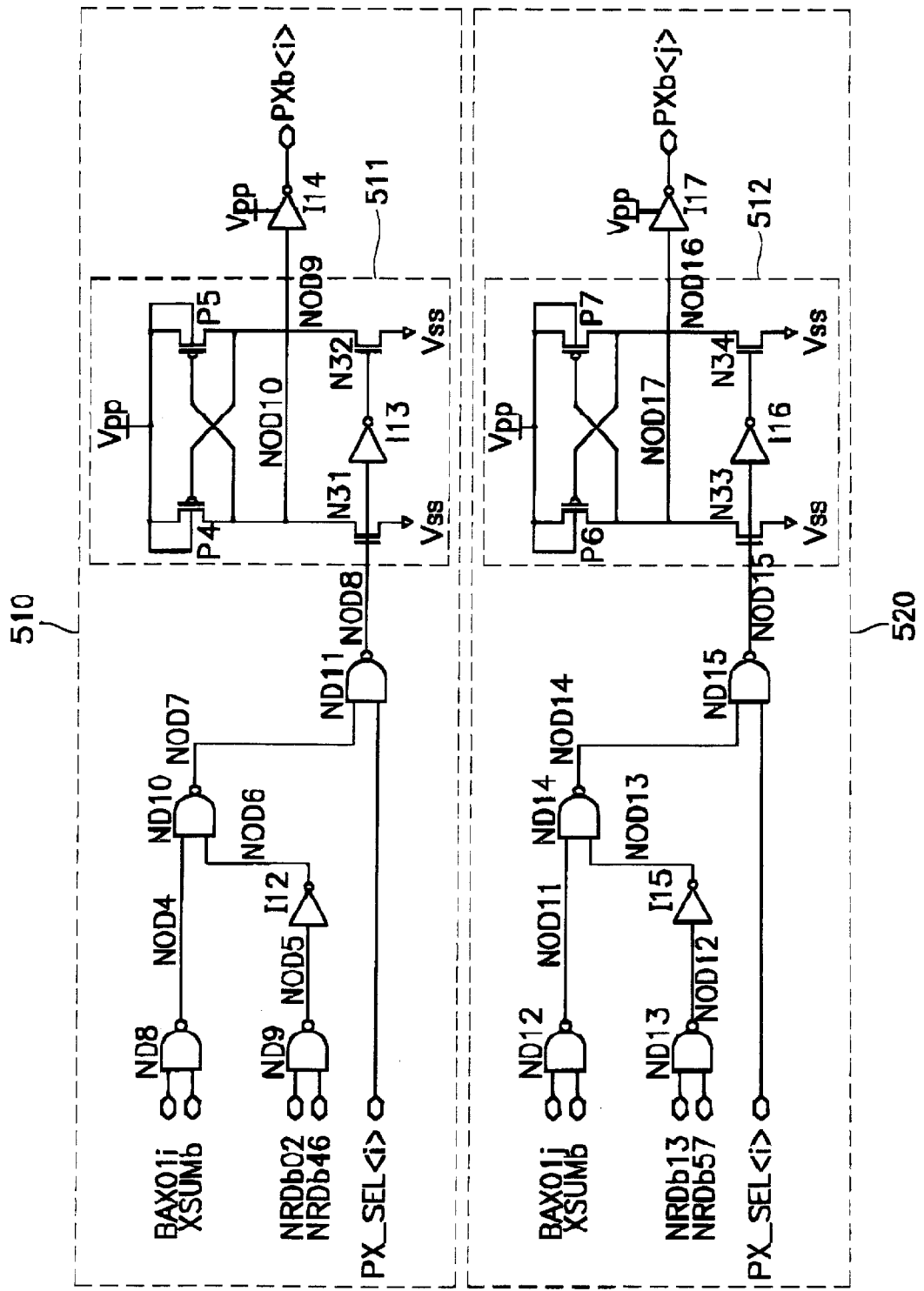
FIG. 9 is a circuit diagram of a sub wordline driver for the redundant block.

Referring to FIG. 9, the redundant sub wordline driver 510 is constructed of NAND gate ND8 receiving the pre-decoded row address signal BAX01i and the first repair information signal XSUMb, NAND gate ND9 receiving signals NRDb02 and NRDb46 which are created from coding the fuse decoding signals, inverter I12 receiving an output signal from the NAND gate ND9, NAND gate ND10 receiving output signals from the NAND gate ND8 and the inverter I12, NAND gate ND11 receiving an output signal from the NAND gate ND10 and the sub wordline driver selection signal PX_SEL<i> (e.g., PX_SEL<0> in FIG. 3), level shifter 511 receiving an output of the NAND gate ND11, and inverter I14 converting an output signal from the level shifter 511 into the sun wordline drive signal PXb<i>.

Another redundant sub wordline driver 520 has the same circuit architecture with that of the redundant sub wordline driver (510), except the orders of the coded signals. That is, the driver 520 receives BAX01j, NRDb13, and NEDb57 while the driver 510 receives BAX01i, NRDb02, and NRDb46.

The conduct of the redundant sub wordline driver 510, which generates the drive signal PXb<i> to control the redundant wordline RWL, is dependent on a logic state of the row address signal BAX01i. When the row address signal BAX01i is selected for activation, the sub wordline drive signal PXbi is enabled. When the row address signal BAX01j is selected for activation, the sub wordline drive signal PXbj is enabled.

The coding mechanisms for the sub wordline drive signals PXb<0> through PXb<3> are figured out in a condition that the row repair fuse boxes designate corresponding sub wordline drivers by correlating the redundant sub wordline drivers to the fuse decoding signals NRDb<0>~NRDb<7>, as follows:

NRDb<0>/NRDb<4>→PXb<0>, NRDb<1>/NRDb<5>→PXb<1>

NRDb<2>/NRDb<6>→PXb<2>, NRDb<3>/NRDb<7>→PXb<3>

The first repair information signal XSUMb and the signals NRDb02~NRDb57 (i.e., NRDb02, NRDb13, NEDb46, and NEDb57) coded from the fuse decoding signals NRDb<i>are employed to determine whether or not there is an occurrence of need for repairing. The reason of that is because the number of the row repair fuse boxes is identical to that of the redundant wordlines. In addition, in the embodied coding configurations, repair information about the memory blocks UB2 and UB3 does not appear because their corresponding block selection signals BSb<2> and BSb<3> are disabled and thereby the sub wordline driver selection signal PX_SEL<1> is disabled.

In a normal operation, the redundant sub wordline drivers 510 and 520 generate the sub wordline drive signals PXb<i> and PXb<j> (e.g., PXb<0> and PXb<1>, respectively) in response to the row address signals BAX01i and BAX01j. In a repair operation, as the first repair information signal XSUMb is at a low level, the row address signals BAX01i and BAX01j are situated in an ineffective state and the sub wordline drive signal PXb<i> and PXb<j> are generated in response to the coded signals NRDb02~NRDb57.

The sub wordline driver selection signals PX_SEL<i> are master signals to determine turn-on or turn-off of the redundant sub wordline drivers 510 and 520, going to a high level when the block selection signal BSb<0> (shown in FIG. 3) for the memory block UB0 or the block selection signal BSb<1> for the memory block UB1 is active at a low level.

Now, it will be explained about a more detail procedure for generating the sub wordline drive signals PXb<i> and PXb<j> (e.g., PXb<0> and PXb<1>, respectively)

First, in the normal operation mode, as the first repair information signal XSUMb is at a high level, the output signal from the NAND gate ND8 becomes a low level in response to the pre-decoded row address signal BAX01i. At this time, according to the coded signals NRDb02 and NRDb46 of a high levels, the output signal of the inverter I12 is set on a high level to make a signal path through node NOD4 be exclusively effective to the output signal of the NAND gate ND10 that is at a high level. When the sub wordline driver selection signal PX_SEL<i> maintains a high level, the NAND gate ND11 applies a low-leveled output signal thereof to the level shifter 511 in response to the high-leveled output signal from the NAND gate ND10 and PX_SEL<i> of a high level. The level shifter 511 pulls a voltage level up to a high level at output node NOD10 in response to the output signal of a low level from the NAND gate ND11. Thereby, the sub wordline drive signal PXb<i> is established on a low level through the inverter I14.

In the repair operation mode, as the first repair information signal XSUMb is at a low level to set the node NOD4 on normally a high level, the output signal of the NAND gate ND10 completely responds to the coded signals NRDb02 and NRDb46 regardless of the row address signal BAX01i. When one of the coded signals NRDb02 and NRDb46 falls down to a low level, the nodes NOD5, NOD6, and NOD7 are at high, low, and high levels, in sequence. As a result, the high-leveled NOD7 and PX_SEL<i> makes the node NOD8 become a low level, and thereby, as is in the normal mode, the sub wordline drive signal PXb<i> is set on a low level.

Figure 10:
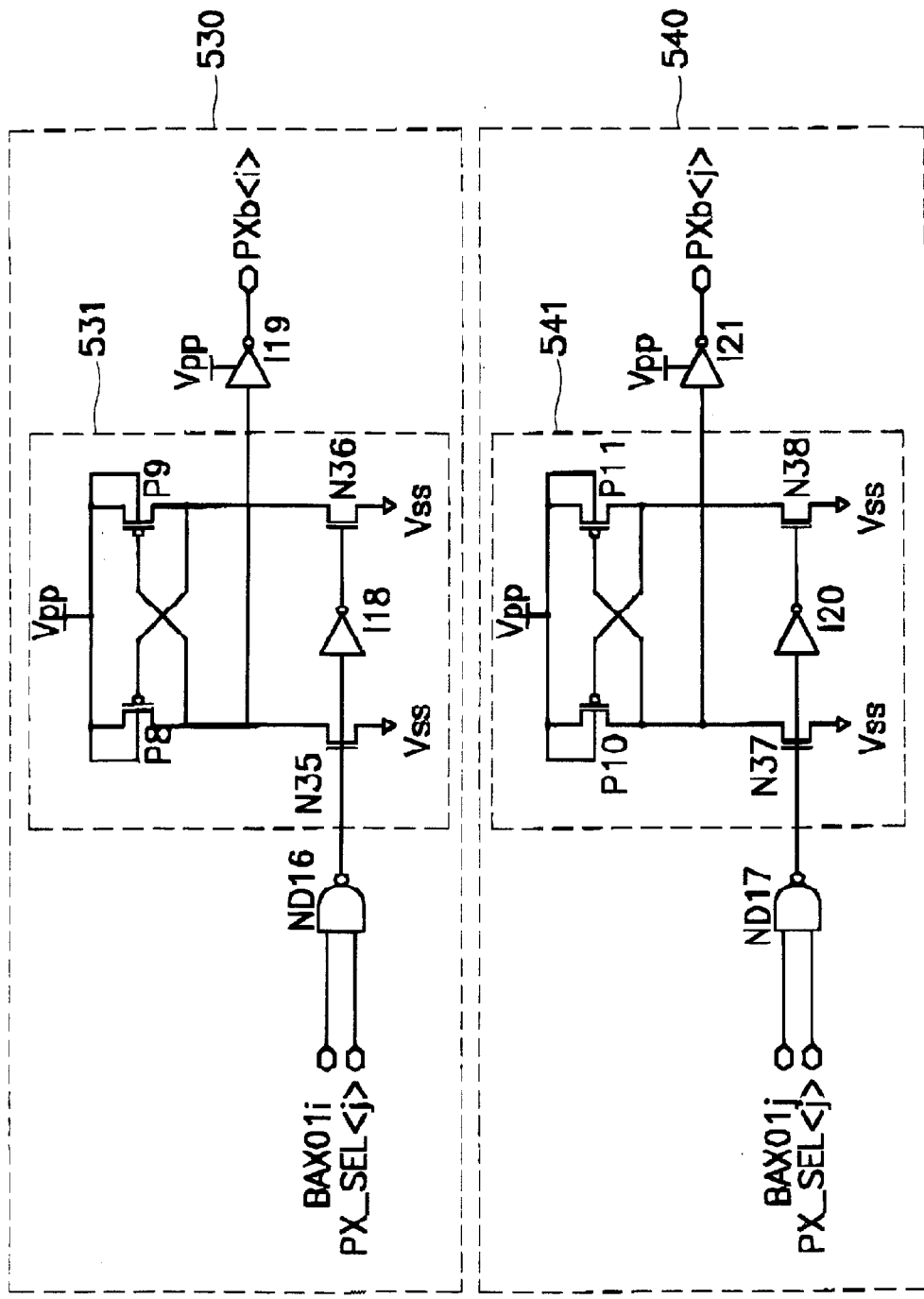
FIG. 10 is a circuit diagram of a sub wordline driver for the normal block.

FIG. 10 illustrates circuits of the normal sub wordline drivers 530 and 540. The drivers 530 and 540 have the same construction, where the driver 530 is formed of NAND gate ND16 receiving the row address signal BAX01i and the sub wordline driver selection signal PX_SEL<j> (e.g., PX_SEL<1> in FIG. 3), level shifter 531 converting an output signal of the NAND gate ND16 into a signal of high voltage (Vpp) or a low level, and inverter I19 converting an output signal into the sub wordline drive signal PXb<i> (i is 4 or 6 in FIG. 3).

As shown in FIG. 10, the normal sub wordline driver 530 (or 540) generates the drive signal PXb<i> (or PXb<j>; j is 5 or 7 in FIG. 3) in response to the predecoded row address signals BAX01i (or BAX01j) and the sub wordline driver selection signal PX_SEL<j> (i.e., PX_SEL<1> in FIG. 3).

Figure 11:
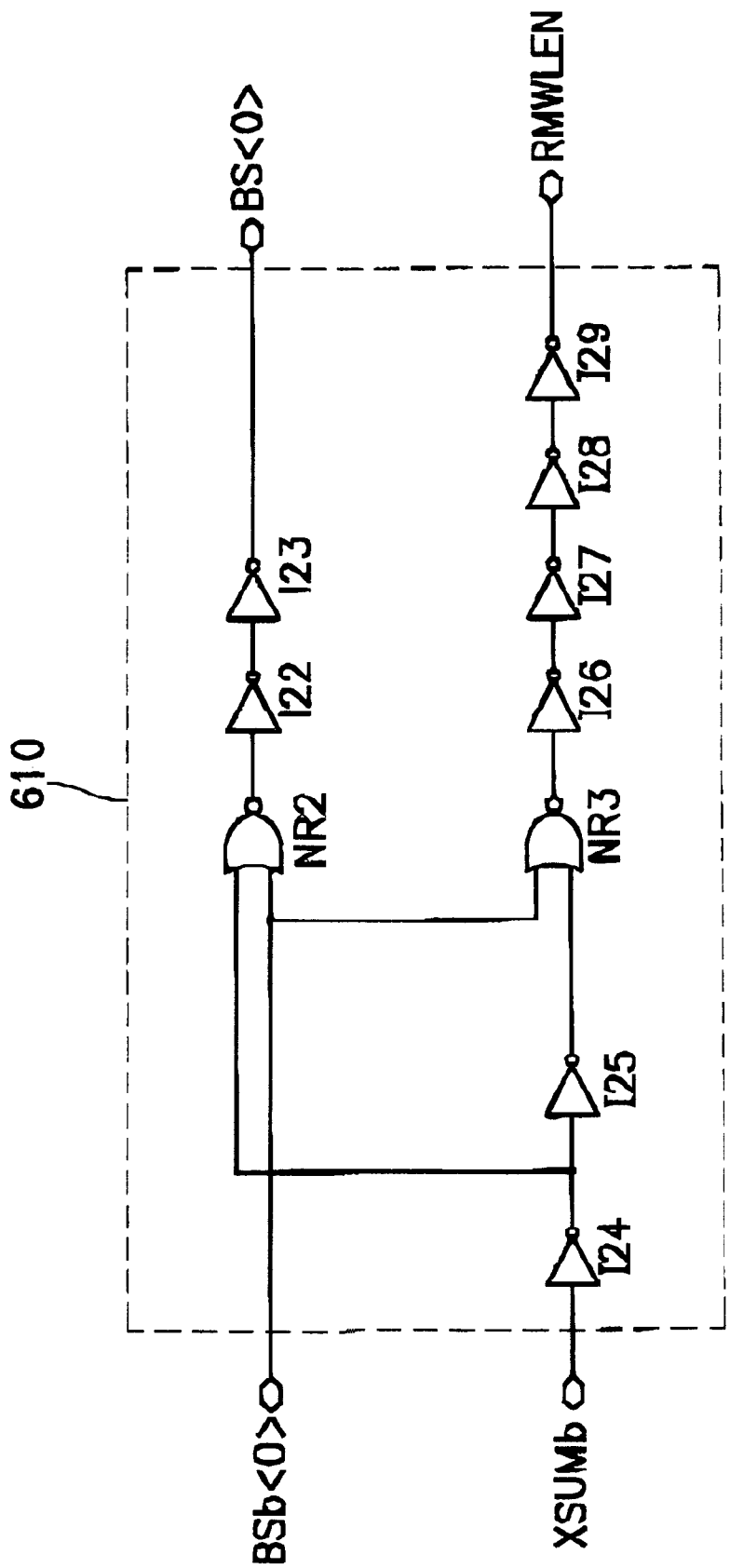
FIG. 11 is a circuit diagram of a redundant main wordline enable signal generator.

The wordline enable signal generator block 600 shown in FIG. 3 includes redundant main wordline enable signal generator 610 and normal main wordline enable signal generators 620s. Referring to FIG. 11, the redundant main wordline enable signal generator 610 is constructed of inverter I24 converting the first repair information signal XSUMb into its reverse signal, NOR gate NR2 receiving the block selection signal BSb<0> and the output signal of the inverter I24, inverter I25 reversing the output signal from the inverter I24, NOR gate NR3 receiving the block selection signal BSb<0> and an output signal of the inverter I25, inverters I22 and I23 converting an output signal of the NOR gate NR2 into the normal main wordline enable signal BS<0>, and inverters I26~I29 converting an output signal of the NOR gate NR3 into the redundant main wordline enable signal RMWLEN.

The redundant main wordline enable signal RMWLEN is made by responding to the first repair information signal XSUMb and the block selection signal BSb<0> that is assigned to a memory block (e.g., UB0) including the redundant wordline RWL.

With respect to an operation in the redundant main wordline enable signal generator 610, during a normal mode where there is no occurrence of repair, as the block selection signal BSb<0> is at a low level and the first repair information signal XSUMb is at a high level, the normal main wordline enable signal BS<0> is enabled with a high level to make the X-decoder (i.e., row decoder) be active while the redundant main wordline enable signal RMWLEN is disabled with a low level. During a repair mode, the first repair information signal XSUMb is set on a low level, and thereby the normal main wordline enable signal BS<0> is turned off with a low level while the redundant main wordline enable signal RMWLEN is enabled with a high level.

Figure 12:
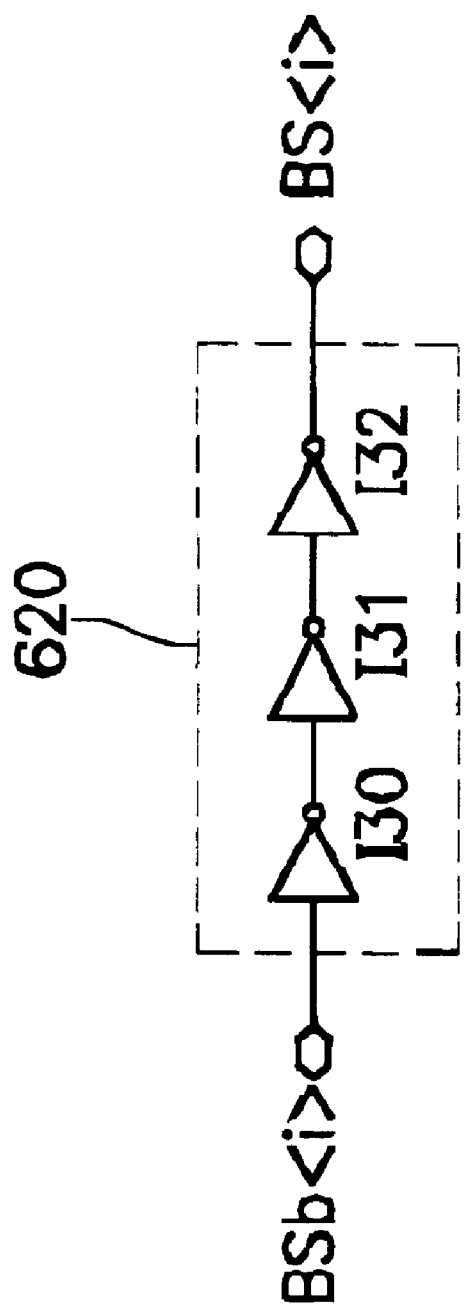
FIG. 12 is a circuit diagram of a normal main wordline enable generator.

FIG. 12 shows the normal main wordline enable signal generator 620 that is associated with the normal memory block (e.g., UB1, UB2, or UB3 in FIG. 3).

The normal main wordline enable signal generator 620 is formed of three inverters 130, 131, and 132, connected in serial, for converting the block selection signal BSb<i> (i is one of 1~3) into the normal main wordline enable signal BS<i> (i is one of 1~3).

When the block selection signal BSb<i> becomes active, regardless of the redundant main wordline enable signal RMWLEN, the normal main wordline enable signal BS<i> is generated with a high level that is an inverted signal from the block selection signal BSb<i> after a delay time by the three inverters. In a repair operation mode, since the block selection signal BSb<i> itself is established at a disable state, the normal main wordline enable signal BS<i> is not activated.

Figure 13:
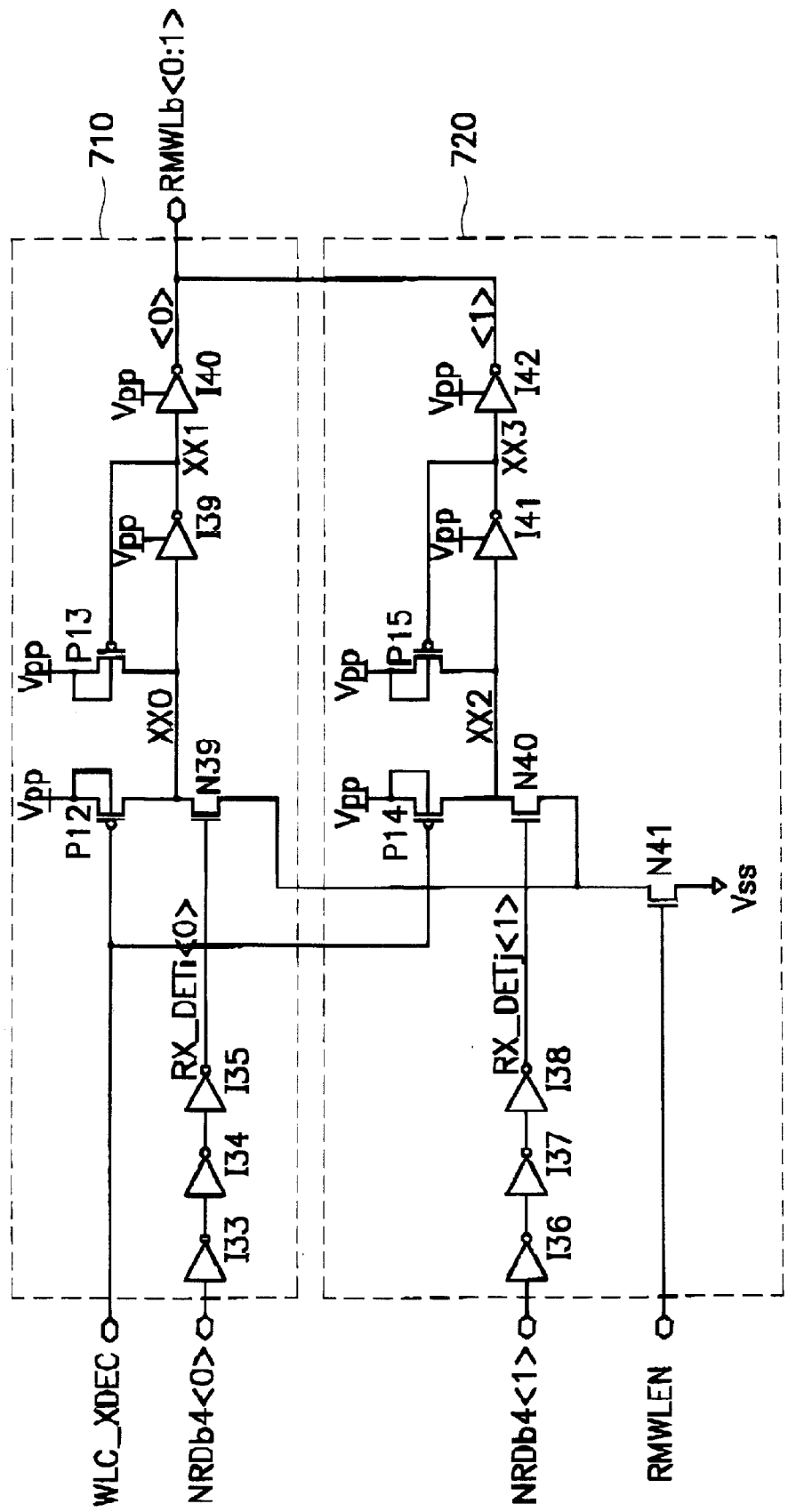
FIG. 13 is a circuit diagram of a redundant main wordline driver.

Next, the redundant main wordline drivers group 700 shown in FIG. 3, referring to FIG. 13, includes two units of the redundant main wordline drivers, 710 and 720, to control the redundant wordline RWL that is enabled by decoding the redundant main wordline drive signal RMWLb and the sub wordline drive signal PXb<i>. One of the drivers, e.g., 710, is constructed of PMOS transistor P12 connected between the high voltage Vpp and node XX0, having its gate coupled to precharge signal WLC_XDEC, NMOS transistor N39 connected between the node XX0 and Vss, having its gate coupled to the summation signal NRDb4<0> through three inverters I33~I35 connected in serial from each other, NMOS transistor N41 connected between the NMOS transistor N39 and Vss, having its gate coupled to the redundant main wordlines enable signal RMWLEN, PMOS transistor P13 connected between Vpp and the node XX0, having a gate coupled to an output signal of inverter I39 that reverses a logic state at the node XX0, and inverter I40 converting the output signal of the inverter I39 into the redundant main wordline drive signal RMWLb<0>. The other one, i.e., 720, has the same constitution with that of the driver 710, except that its corresponding signal RMWLb<1> is made by responding the summation signal NRDb<1>. The PMOS transistor P13 (or P15) and the inverter I39 (or I41) form a latch circuit to hold a logic state at the node XX0 (or XX2) until a new valid summation signal NRDb4<0> (or NRDb4<1>) is applied thereto.

The signals RX_DET<0> and RX_DET<1> are generated from inverting the summation signals NRDb4<0> and NRDb<1>, respectively, supplied from the fuse summation circuit 200, and, in a repair mode, go to high levels, each in response to the summation signals NRDb4<0> and NRDb<1> of a low levels. The precharge signal WLC_XDEC is provided to the driver 710 in order to charge the node XX0 up to a predetermined voltage level in advance, being also applied to a main X-decoder (not shown). When the precharge signal WLC_XDEC is at a low level, the nodes XX0 and XX2 are charged up to high levels and thereby the redundant main wordline drive signals RMWLb<0> and RMWLb<1> are precharged with high levels.

During a repair operation mode, as the redundant main wordline enable signal RMWLEN is at a high level, the NMOS transistor N41 is turned on and thereby the redundant main wordline drive signal RMWLb<0> or RMWLb<1> is enabled.

The two redundant main wordline drive signals RMWLb<0:1> (RMWLb<0> and RMWLb<1>) are employed to operate the eight redundant wordlines RWL<0:7> arranged in the memory block UB0 after being decoded with the four sub wordline drive signals PXb<0:3> supplied from the redundant sub wordline drivers 510s and 520s.

While the aforementioned configurations for performing normal and repair operations are involved in the unit of four memory blocks UB0~UB4 (the upper half in a memory bank, as shown in FIG. 2) in which the memory block UB0 has the eight redundant wordlines, it is easy to understand that the other memory blocks UB4~UB7 (in this case, the eight redundant wordlines are arranged in UB7) are also operable with the same manner as the above constructions of the circuits and procedures thereof.

As seen in the drawings and description above, the present invention provides advanced constructions for repairing to be able to enhance efficiency of a repair operation by disposing the redundant wordlines in a specific memory block. The memory block including the redundant wordlines is conductive whenever there is a need of repairing, regardless of a location of a memory block having a defective wordline (or a defective memory cell). Such enhancement of the repair efficiency with flexible substitution architecture increases the product yield of semiconductor memory devices, and also contributes to reduce the cost per chip (or the cost per bit) and to ensure a competitive price of a semiconductor memory device in a market.

Although the preferred embodiments of the present invention have been disclosed for illustrative purposes, those skilled in the art will appreciate that various modifications, additions and substitutions are possible, without departing from the scope and spirit of the invention as described in the accompanying claims

What is claimed is:

1. A semiconductor memory device having improved redundancy efficiency, the device comprising:
    a plurality of memory blocks having a predetermined number of redundant word-lines, wherein all the redundant word-lines are not distributed at all the memory blocks equivalently but are distributed at only predetermined ones of the memory blocks;
    a predetermined number of row repair fuse being impartially allotted to all the memory blocks; and
    repair means to replace defective word-lines with the redundant word-lines, each of the redundant word-lines corresponds to one of the row repair fuse boxes respectively.

2. The semiconductor memory device of claim 1, wherein the row repair fuse boxes generate fuse decoding signals in response to row address signals, block address signals, and precharge signal.

3. The semiconductor memory device of claim 2, wherein the row repair fuse box comprises:
    a fuse decoding circuit for generating the fuse decoding signal in response to the row address signals and the block address signals;
    a switch for connecting a power supply voltage to the fuse decoding circuit in response to the precharge signal; and
    a latch circuit for holding a current voltage level of the fuse decoding signal.

4. The semiconductor memory device of claim 3, wherein the fuse decoding circuit comprises:
    a plurality of fuses connected to a sensing node that is commonly connected to the switch and an input of the latch circuit; and
    a plurality of switches connected between the fuses and a ground voltage and its gate coupled to the row address signals and the block address signals.

5. The semiconductor memory device of claim 1, wherein the repair means comprises:
    fuse summation means for generating summation signals, a first repair information signal, and a second repair information signal in response to fuse decoding signals supplied from the row repair fuse boxes;
    block selection means for generating block selection signals in response to the first repair information signal, the second repair information signal, the block address signals, and block selection enable signals;
    sub wordline driver selection means for generating sub wordline driver selection signals in response to the block selection signals;
    sub wordline drivers for generating sub wordline drive signals in response to the sub wordline driver selection signals, a part of the row address signals, the fuse decoding signals, and the first repair information signal;
    wordline enable signal generating means for creating a redundant main wordline enable signal and normal main wordline enable signals in response to the first repair information signal and the block selection signals; and
    redundant main wordline drivers for generating redundant main wordline drive signals in response to inverted signals of the summation signals, the redundant main wordline enable signal, and a precharge signal;
    wherein the redundant wordlines are conductive by decoding the sub wordline drive signals from the sub wordline drivers and the redundant main wordline drive signals from the redundant main wordline drivers.

6. The semiconductor memory device of claim 5, wherein the fuse summation means comprises:
    a first logic element for receiving a first fuse decoding signal and a second fuse decoding signal;
    a second logic element for receiving a third fuse decoding signal and a fourth fuse decoding signal;
    a third logic element for receiving a fifth fuse decoding signal and a sixth fuse decoding signal;
    a fourth logic element for receiving a seventh fuse decoding signal and a eighth fuse decoding signal;
    a fifth logic element for receiving output signals from the first and second logic elements;
    a sixth logic element for receiving output signals from the third and fourth logic elements;
    a seventh logic element for receiving output signals from the fifth and sixth elements and for generating the second repair information signal;
    an inverting elements for receiving an output signal from the seventh logic signal and for generating the first repair information signal.

7. The semiconductor memory device of claim 5, wherein the block selection means comprises:
    a redundant block selection circuit for making the memory block including the redundant wordlines be enabled without receiving the row address signals during a repair operation; and
    normal block selection circuits for receiving the row address signals each corresponding to the other memory blocks during an absence of repairing.

8. The semiconductor memory device of claim 7, wherein the redundant block selection circuit comprises:
    a first inverting element for receiving the block selection enable signal;
    a first switching element for connecting a power supply voltage to a first node in response to an output signal of the first inverting element;

a second switching element for connecting the first node to a second node in response to the output signal of the first inverting element;

a latch circuit connected between the first node and a third node;

a second inverting element for converting an output signal of the latch circuit into the block selection signal;

a third switching element for connecting the second node to a ground voltage in response to the first repair information signal;

a logic element for receiving the block address signals;

a third inverting element for receiving an output signal of the logic element;

a fourth switching element for connecting the third switching element to the ground voltage in response to an output signal of the third inverting element; and a fifth switching element for connecting the second node to the ground voltage in response to the second repair information signal.

9. The semiconductor memory device of claim 7, wherein the normal block selection circuit comprises:

a first inverting element for receiving the block selection enable signal;

a first switching element for connecting a power supply voltage to a first node in response to an output signal of the first inverting element;

a second switching element for connecting the first node to a second node in response to the output signal of the first inverting element;

a latch circuit connected between the first node and a third node;

a second inverting element for converting an output signal of the latch circuit into the block selection signal;

a third switching element for connecting the second node to a ground voltage in response to the first repair information signal;

a logic element for receiving the block address signals;

a third inverting element for receiving an output signal of the logic element; and a fourth switching element for connecting the third switching element to the ground voltage in response to an output signal of the third inverting element.

10. The semiconductor memory device of claim 5, wherein the sub wordline driver selection means comprises a NAND gate for receiving the block selection signals and for generating a sub wordline driver selection signal.

11. The semiconductor memory device of claim 5, wherein the sub wordline drivers comprises:

redundant sub wordline drivers disposed in the memory block including the redundant wordlines; and normal sub wordline drivers disposed in the other memory blocks without the redundant wordlines.

12. The semiconductor memory device of claim 11, wherein the redundant sub wordline driver comprises:

a first logic element for receiving a part of the row address signals and the first repair information signal;

a second logic element for receiving signals coded from the summation signals;

a first inverting element for receiving an output signal of the second logic element;

a third logic element for receiving output signals from the first logic element and the first inverting element;

a fourth logic element for receiving an output signal of the third logic element and the sub wordline selection signal;

a level shifter for receiving an output signal of the fourth logic element; and a second inverting element for converting an output signal from the level shifter into the sub wordline drive signal.

13. The semiconductor memory device of claim 11, wherein the normal sub wordline driver comprises:

a logic element for receiving the row address signal and the sub wordline driver selection signal;

a level shifter for receiving an output signal from the logic element; and an inverting element for converting an output signal of the level shifter into the sub wordline drive signal.

14. The semiconductor memory device of claim 5, the wordline enable signal generating means comprises:

a redundant main wordline enable signal generator selected when there is a presence of repairing; and a normal main wordline enable signal generator selected when there is an absence of repairing.

15. The semiconductor memory device of claim 14, wherein the redundant main wordline enable signal generator comprises:

a first inverting element for receiving the first repair information signal;

a first logic element for receiving the block selection signal from the block selection means and an output signal from the first inverting element;

a plurality of second inverting elements for converting an output signal of the first logic element;

a third inverting element for receiving the output signal from the first inverting element;

a second logic element for receiving the block selection signal and an output signal of the third inverting element; and a plurality of fourth inverting elements for converting an output signal of the second logic element into the redundant main wordline enable signal.

16. The semiconductor memory device of claim 14, wherein the normal main wordline enable signal generator comprises a plurality of inverting elements for converting the block selection signal from the block selection means into the normal main wordline enable signal.

17. The semiconductor memory device of claim 5, wherein the redundant main wordline driver comprises:

a first switching element for connecting a high voltage to a first node in response to the precharge signal;

a second switching element for connecting the first node to a ground voltage in response to an inverted signal of the summation signal;

a third switching element for connecting the second switching element to the ground voltage in response to the redundant main wordline enable signal;

a first inverting element connected between the first node and a second node;

a fourth switching element for connecting the high voltage to the first node in response to an output signal of the first inverting element; and a second inverting element for converting the output signal of the first inverting element into the redundant main wordline drive signal.

* * * * *